United States Patent
Fu et al.

(10) Patent No.: US 10,825,537 B2
(45) Date of Patent: Nov. 3, 2020

(54) SHIFT REGISTER UNIT, DRIVING METHOD, GATE DRIVING CIRCUIT AND DISPLAY DEVICE

(71) Applicants: Ordos Yuansheng Optoelectronics Co., Ltd., Ordos, Inner Mongolia (CN); BOE Technology Group Co., Ltd., Beijing (CN)

(72) Inventors: Yishan Fu, Beijing (CN); Jun Fan, Beijing (CN); Fuqiang Li, Beijing (CN); Han Zhang, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/477,362

(22) PCT Filed: Aug. 23, 2018

(86) PCT No.: PCT/CN2018/101980
§ 371 (c)(1),
(2) Date: Jul. 11, 2019

(87) PCT Pub. No.: WO2019/080626
PCT Pub. Date: May 2, 2019

(65) Prior Publication Data
US 2019/0385688 A1 Dec. 19, 2019

(30) Foreign Application Priority Data
Oct. 27, 2017 (CN) .......................... 2017 1 1024210

(51) Int. Cl.
*G11C 19/28* (2006.01)
*G09G 3/20* (2006.01)

(52) U.S. Cl.
CPC ............... *G11C 19/28* (2013.01); *G09G 3/20* (2013.01); *G09G 2310/0286* (2013.01)

(58) Field of Classification Search
CPC ... G11C 19/28; G09G 3/20; G09G 2310/0286
See application file for complete search history.

(56) References Cited

U.S. PATENT DOCUMENTS

2012/0038609 A1  2/2012  Chung
2015/0131771 A1  5/2015  Hu et al.
(Continued)

FOREIGN PATENT DOCUMENTS

CN  103400558 A  11/2013
CN  104571710 A  4/2015
(Continued)

OTHER PUBLICATIONS

First office action of Chinese application No. 201711024210.4 dated Aug. 12, 2019.
(Continued)

*Primary Examiner* — Mihir K Rayan
(74) *Attorney, Agent, or Firm* — Fay Sharpe LLP

(57) ABSTRACT

A shift register unit, a driving method, a gate driving circuit and a display device are provided. The shift register unit includes: an input circuit used to provide a pull-up node with a first control signal from a first control signal terminal; N output circuits, wherein an i-th output circuit is used to provide an i-th output terminal with an i-th clock signal from an i-th clock signal terminal; a pull-down control circuit used to provide a pull-down node with a first power source signal from a first power source terminal, and to provide the pull-down node with a second power source signal from a second power source terminal; and a pull-down circuit used to provide each output terminal and the pull-up node with the second power source signal.

20 Claims, 8 Drawing Sheets

(56) References Cited

U.S. PATENT DOCUMENTS

| | | | |
|---|---|---|---|
| 2015/0371716 A1* | 12/2015 | Shao | G11C 19/287 345/100 |
| 2016/0232865 A1* | 8/2016 | Hao | G11C 19/28 |
| 2016/0267871 A1 | 9/2016 | Kim et al. | |
| 2016/0370918 A1 | 12/2016 | Huang | |
| 2017/0076680 A1 | 3/2017 | Li | |
| 2017/0199617 A1* | 7/2017 | Gu | G06F 3/0416 |
| 2017/0221441 A1* | 8/2017 | Gu | G06F 3/044 |
| 2017/0330526 A1 | 11/2017 | Fan | |
| 2018/0061508 A1 | 3/2018 | Chen | |
| 2018/0330667 A1 | 11/2018 | Yuan et al. | |
| 2019/0006018 A1 | 1/2019 | Fang | |
| 2019/0304393 A1* | 10/2019 | Wang | G09G 3/3677 |

FOREIGN PATENT DOCUMENTS

| | | |
|---|---|---|
| CN | 105047172 A | 11/2015 |
| CN | 105096865 A | 11/2015 |
| CN | 105590612 A | 5/2016 |
| CN | 105869566 A | 8/2016 |
| CN | 106023943 A | 10/2016 |
| CN | 106601175 A | 4/2017 |
| CN | 106991958 A | 7/2017 |
| CN | 107068077 A | 8/2017 |
| CN | 107170411 A | 9/2017 |
| CN | 107564458 A | 1/2018 |
| KR | 20150002030 A | 1/2015 |

OTHER PUBLICATIONS

International search report of PCT application No. PCT/CN2018/101980 dated Nov. 23, 2018.

* cited by examiner

SHIFT REGISTER UNIT, DRIVING METHOD, GATE DRIVING CIRCUIT AND DISPLAY DEVICE

CROSS-REFERENCE TO RELATED APPLICATION

This application is a 371 of PCT Patent Application Serial No. PCT/CN2018/101980, filed on Aug. 23, 2018, which claims priority to Chinese Patent Application No. 201711024210.4, filed with the National Intellectual Property Administration of P.R.C on Oct. 27, 2017 and entitled "SHIFT REGISTER UNIT, DRIVING METHOD, GATE DRIVING CIRCUIT AND DISPLAY DEVICE", the entire contents of which are incorporated herein by reference.

TECHNICAL FIELD

The present disclosure relates to a shift register unit, a driving method, a gate driving circuit and a display device.

BACKGROUND

When displaying an image, a display device needs a gate driving circuit to scan pixel units. A gate driving circuit (also called as a shift register) includes a plurality of cascaded shift register units, each of which corresponds to one row of pixel units. The plurality of shift register units implement the row-by-row scanning and driving of the pixel units in the display device so as to display an image.

With the increase of pixel amount in the display device, the gate driving circuit needs to scan more rows of pixel units during one frame. In addition, with the requirement of the display device with an extra-narrow bezel, the layout area of the shift register units need to be smaller.

SUMMARY

The present disclosure provides a shift register unit, a driving method, a gate driving circuit and a display device.

According to a first aspect of the present disclosure, there is provided a shift register unit, and the shift register unit comprises: an input circuit respectively connected to a first input signal terminal, a first control signal terminal and a pull-up node, and used to provide the pull-up node with a first control signal from the first control signal terminal under control of an input signal from the first input signal terminal; N output circuits, wherein an i-th output circuit is respectively connected to an i-th clock signal terminal of N clock signal terminals, the pull-up node and an i-th output terminal of N output terminals, and is used to provide the i-th output terminal with an i-th clock signal from the i-th clock signal terminal under control of the pull-up node, wherein each output terminal of the N output terminals is connected to one gate line, N is an integer greater than or equal to 2, and i is a positive integer less than or equal to N; a pull-down control circuit respectively connected to the first control signal terminal, a first reset clock signal terminal, a first power source terminal, a second power source terminal, the pull-up node and a pull-down node, and used to provide the pull-down node with a first power source signal from the first power source terminal under control of the first control signal and a first reset clock signal from the first reset clock signal terminal, and to provide the pull-down node with a second power source signal from the second power source terminal under control of the pull-up node; and a pull-down circuit respectively connected to the second power source terminal, each output terminal, the pull-up node and the pull-down node, and used to respectively provide each output terminal and the pull-up node with the second power source signal under control of the pull-down node.

Optionally, the i-th output circuit comprises: a first transistor; wherein a gate of the first transistor is connected to the pull-up node, a first electrode of the first transistor is connected to the i-th clock signal terminal, and a second electrode of the first transistor is connected to the i-th output terminal.

Optionally, the i-th output circuit further comprises: a second transistor; wherein a gate of the second transistor is connected to the first power source terminal, a first electrode of the second transistor is connected to the pull-up node, and a second electrode of the second transistor is connected to the gate of the first transistor.

Optionally, the input circuit comprises: a third transistor; wherein a gate of the third transistor is connected to the first input signal terminal, a first electrode of the third transistor is connected to the first control signal terminal, and a second electrode of the third transistor is connected to the pull-up node.

Optionally, the input circuit is further connected to a second input signal terminal and a second control signal terminal; and the input circuit further comprises: a fourth transistor; wherein a gate of the fourth transistor is connected to the second input signal terminal, a first electrode of the fourth transistor is connected to the second control signal terminal, and a second electrode of the fourth transistor is connected to the pull-up node.

Optionally, the pull-down control circuit comprises: a fifth transistor, a sixth transistor and a seventh transistor; wherein a gate of the fifth transistor is connected to the first control signal terminal, a first electrode of the fifth transistor is connected to the first reset clock signal terminal, and a second electrode of the fifth transistor is connected to a gate of the seventh transistor; a gate of the sixth transistor is connected to the pull-up node, a first electrode of the sixth transistor is connected to the second power source terminal, and a second electrode of the sixth transistor is connected to the pull-down node; and a first electrode of the seventh transistor is connected to the first power source signal terminal, and a second electrode of the seventh transistor is connected to the pull-down node.

Optionally, the pull-down control circuit is further connected to a second reset clock signal terminal and a second control signal terminal; and the pull-down control circuit further comprises: an eighth transistor; wherein a gate of the eighth transistor is connected to the second control signal terminal, a first electrode of the eighth transistor is connected to the second reset clock signal terminal, and a second electrode of the eighth transistor is connected to the gate of the seventh transistor.

Optionally, the pull-down circuit comprises: a first pull-down sub-circuit respectively connected to the pull-down node, the second power source terminal and the pull-up node, and used to provide the pull-up node with the second power source signal under control of the pull-down node; and N second pull-down sub-circuits, wherein an i-th second pull-down sub-circuit is respectively connected to the pull-down node, the second power source terminal and the i-th output terminal, and used to provide the i-th output terminal with the second power source signal under control of the pull-down node.

Optionally, the first pull-down sub-circuit comprises: a ninth transistor, wherein a gate of the ninth transistor is connected to the pull-down node, a first electrode of the ninth transistor is connected to the second power source terminal and a second electrode of the ninth transistor is connected to the pull-up node.

Optionally, among the N second pull-down sub-circuits, an i-th second pull-down sub-circuit comprises: a tenth transistor, wherein a gate of the tenth transistor is connected to the pull-down node, a first electrode of the tenth transistor is connected to the second power source terminal and a second electrode of the tenth transistor is connected to the i-th output terminal.

Optionally, the shift register unit further comprises: a discharging circuit respectively connected to a discharging control terminal, the pull-down node and the second power source terminal, and used to provide the pull-down node with a third power source signal from the second power source terminal under control of a discharging control signal from the discharging control terminal, and a potential of the third power source signal is at the first potential.

Optionally, the discharging circuit comprises: an eleventh transistor; wherein a gate of the eleventh transistor is connected to the discharging control terminal, a first electrode of the eleventh transistor is connected to the second power source terminal, and a second electrode of the eleventh transistor is connected to the pull-down node.

Optionally, the i-th output circuit comprises: a first transistor, the input circuit comprises: a third transistor, the pull-down control circuit comprises: a fifth transistor, a sixth transistor and a seventh transistor, and the pull-down circuit comprises: a ninth transistor and N tenth transistors, wherein a gate of the first transistor is connected to the pull-up node, a first electrode of the first transistor is connected to the i-th clock signal terminal, and a second electrode of the first transistor is connected to the i-th output terminal; a gate of the third transistor is connected to the first input signal terminal, a first electrode of the third transistor is connected to the first control signal terminal, and a second electrode of the third transistor is connected to the pull-up node; a gate of the fifth transistor is connected to the first control signal terminal, a first electrode of the fifth transistor is connected to the first reset clock signal terminal, and a second electrode of the fifth transistor is connected to a gate of the seventh transistor; a gate of the sixth transistor is connected to the pull-up node, a first electrode of the sixth transistor is connected to the second power source terminal, and a second electrode of the sixth transistor is connected to the pull-down node; and a first electrode of the seventh transistor is connected to the first power source signal terminal, and a second electrode of the seventh transistor is connected to the pull-down node a gate of the ninth transistor is connected to the pull-down node, a first electrode of the ninth transistor is connected to the second power source terminal, and a second electrode of the ninth transistor is connected to the pull-up node; and a gate of an i-th tenth transistor is connected to the pull-down node, a first electrode of the i-th tenth transistor is connected to the second power source terminal, and a second electrode of the i-th tenth transistor is connected to the i-th output terminal.

Optionally, the i-th output circuit further comprises: a second transistor and a first capacitor, the input circuit is further connected to a second input signal terminal and a second control signal terminal, the input circuit further comprises: a fourth transistor and a second capacitor, the pull-down control circuit further comprises: an eighth transistor and a third capacitor, the shift register unit further comprises: a discharging circuit, and the discharging circuit comprises: an eleventh transistor; wherein a gate of the second transistor is connected to the first power source terminal, a first electrode of the second transistor is connected to the pull-up node, and a second electrode of the second transistor is connected to the gate of the first transistor; one terminal of the first capacitor is connected to the gate of the first transistor, and the other terminal of the first capacitor is connected to the second electrode of the first transistor; a gate of the fourth transistor is connected to the second input signal terminal, a first electrode of the fourth transistor is connected to the second control signal terminal, and a second electrode of the fourth transistor is connected to the pull-up node; one terminal of the second capacitor is connected to the pull-up node, and the other terminal of the second capacitor is connected to the second power source terminal; a gate of the eighth transistor is connected to the second control signal terminal, a first electrode of the eighth transistor is connected to the second reset clock signal terminal, and a second electrode of the eighth transistor is connected to the gate of the seventh transistor; one terminal of the third capacitor is connected to the pull-down node and the other terminal of the third capacitor is connected to the second power source terminal; and a gate of the eleventh transistor is connected to the discharging control terminal, a first electrode of the eleventh transistor is connected to the second power source terminal, and a second electrode of the eleventh transistor is connected to the pull-down node.

According to another aspect of the present disclosure, there is provided a driving method for a shift register unit, wherein the shift register unit comprises: an input circuit, a pull-down control circuit, a pull-down circuit and N output circuits, the N is an integer greater than or equal to 2; and the method comprises: during a charging stage, in which a first control signal from a first control signal terminal is at a first potential and an input signal from a first input signal terminal is at a first potential, providing, by the input circuit, a pull-up node with the first control signal under the control of the input signal; during an i-th output stage of N output stages, in which an i-th clock signal from an i-th clock signal terminal of N clock signal terminals is at a first potential and the pull-up node is maintained at the first potential, providing the i-th clock signal under the control of the pull-up node by an i-th output terminal of an i-th output circuit, wherein i is a positive integer less than or equal to N; and during a noise-reducing stage, in which the first control signal is at a first potential and a first reset clock signal from a first reset clock signal terminal is at a first potential, providing, by the pull-down control circuit, the pull-down node with a first power source signal from a first power source terminal under control of the first reset clock signal and the first control signal, and respectively providing, by the pull-down circuit, the pull-up node and each output terminal with a second power source signal from a second power source terminal under control of the pull-down node.

Optionally, the shift register unit further comprises: a discharging circuit, and the method further comprising: during a discharging stage, in which a discharging control signal from a discharging control terminal is at a first potential and a third power source signal from the second power source terminal is at a first potential, providing, by the discharging circuit, the pull-down node with the third power source signal under control of the discharging control signal.

According to yet another aspect of the present disclosure, there is provided a gate driving circuit, and the gate driving circuit comprises M cascaded shift register units, wherein M is an integer greater than 1; and the shift register unit comprises: an input circuit respectively connected to a first input signal terminal, a first control signal terminal and a pull-up node, and used to provide the pull-up node with a first control signal from the first control signal terminal under control of an input signal from the first input signal terminal; N output circuits, wherein an i-th output circuit is respectively connected to an i-th clock signal terminal of N clock signal terminals, the pull-up node and an i-th output terminal of N output terminals, and is used to provide the i-th output terminal with an i-th clock signal from the i-th clock signal terminal under control of the pull-up node, wherein each output terminal of the N output terminals is connected to one gate line, N is an integer greater than or equal to 2, and i is a positive integer less than or equal to N; a pull-down control circuit respectively connected to the first control signal terminal, a first reset clock signal terminal, a first power source terminal, a second power source terminal, the pull-up node and a pull-down node, and used to provide the pull-down node with a first power source signal from the first power source terminal under control of the first control signal and a first reset clock signal from the first reset clock signal terminal, and to provide the pull-down node with a second power source signal from the second power source terminal under control of the pull-up node; a pull-down circuit respectively connected to the second power source terminal, each output terminal, the pull-up node and the pull-down node, and used to respectively provide each output terminal and the pull-up node with the second power source signal under control of the pull-down node; and among the M shift register units, an N-th output terminal of a j-th shift register unit is connected to a first input signal terminal of an (j+1)-th shift register unit, wherein j is a positive integer less than M.

Optionally, the M shift register units comprise two groups of shift register units that are at two sides facing each other on a display panel.

Optionally, among the M shift register units, a (2×p−1)-th shift register unit is at a first side of the display panel, and a (2×p)-th shift register unit is at a second side of the display panel, wherein the first side and the second side are two sides facing each other on the display panel, and p is a positive integer no greater than M/2.

According to another aspect of the present disclosure, there is provided a display device and the display device comprises the gate driving circuit according to the present disclosure.

According to another aspect of the present disclosure, there is provided a storage medium, and the storage medium stores computer programs, which implements the driving method for a shift register unit according to the present disclosure when executed by a processor.

DETAILED DESCRIPTION

Figure 1:
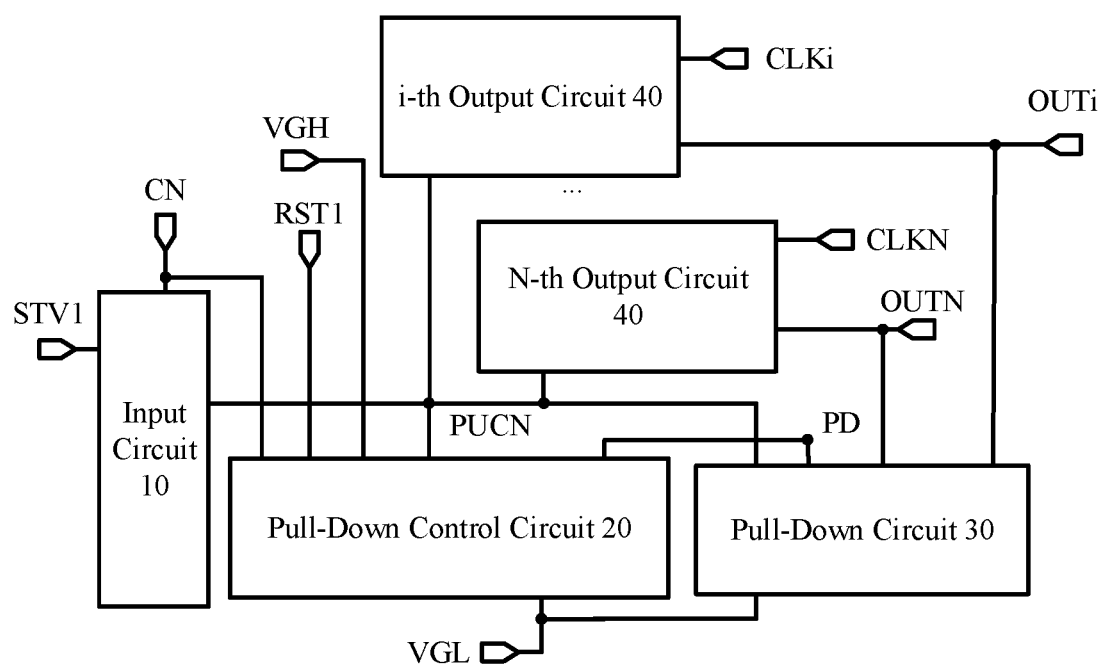
FIG. 1 is a structural schematic diagram of a shift register unit according to an embodiment of the present disclosure.

The embodiments of the present disclosure will be described in further detail with reference to the accompanying drawings, to present the principles and advantages of the present disclosure more clearly.

Transistors adopted in all the embodiments of the present disclosure may be thin-film transistors or field-effect transistors or other devices having the same features. According to the function in a circuit, the transistors adopted in the embodiments of the present disclosure are generally switch transistors. Since a source and drain of a switch transistor adopted herein are symmetric, the source and drain may be exchanged. In the embodiments of the present disclosure, the source is referred to as a first electrode and the drain is referred to as a second electrode. According to the form in the drawings, it is specified that a middle terminal of a transistor is the gate, a signal input terminal is the source, and a signal output terminal is the drain. The switch transistors adopted in the embodiments of the present disclosure may include any of P-type switch transistors and N-type transistors. The P-type switch transistor is turned on when the gate is at a low potential, and is turned off when the gate is at a high potential. The N-type switch transistor is turned on when the gate is at a high potential, and is turned off when the gate is at a low potential. In various embodiments of the present disclosure, each of a plurality of signals has a first potential and a second potential. The first potential and the second potential only indicate that the potential of the signal has two different state quantities, instead of indicating that the first potential or the second potential herein in this specification has a specific value.

The following embodiments of the present disclosure are illustrated by taking the transistors are N-type transistors and the first potential is a high potential relative to the second potential as an example.

As known to the inventors, there exists a shift register unit which controls the potential of gate driving signals output by the shift register units through a plurality of transistors and capacitors.

However, as the shift register unit controls the potential of gate driving signals output by the shift register units through a plurality of transistors and capacitors, the shift register unit includes many elements, which causes the gate driving circuit to occupy a large layout area in the display device.

Wherein, the gate driving circuit is also called as a shift register, which includes a plurality of cascaded shift register units, and a shift register unit may also called as a GOA unit.

In the embodiments of the present disclosure, there is provided a shift register unit. FIG. 1 is a structural schematic diagram of a shift register unit according to an embodiment of the present disclosure. Referring to FIG. 1, the shift register unit may include: an input circuit 10, a pull-down control circuit 20, a pull-down circuit 30 and N output circuits 40. Here, N is an integer greater than or equal to 2.

The input circuit 10 is connected to a first input signal terminal STV1, a first control signal terminal CN and a pull-up node PUCN, respectively. The input circuit 10 is used to provide the pull-up node PUCN with a first control signal from the first control signal terminal CN under the control of an input signal from the first input signal terminal STV1. For example, when the potential of the input signal and the potential of the first control signal are both the first potential, the input circuit 10 provides the pull-up node PUCN with the first control signal at the first potential under the control of the input signal at the first potential, to charge the pull-up node PUCN.

Among the N output circuits 40, an i-th output circuit 40 is connected to an i-th clock signal terminal CLKi of N clock signal terminals, the pull-up node PUCN and an i-th output terminal OUTi of N output terminals, respectively. The i-th output circuit 40 is used to provide the i-th output terminal OUTi with an i-th clock signal from the i-th clock signal terminal CLKi under the control of the pull-up node PUCN. Each output terminal of the N output terminals is connected to one gate line, and is used to provide the display panel with a gate driving signal. i is a positive integer less than or equal to N. For example, when the i-th clock signal from the i-th clock signal terminal CLKi is at the first potential and the pull-up node PUCN is at the first potential, the i-th output circuit provides the i-th output terminal OUTi with the i-th clock signal at the first potential under the control of the pull-up node PUCN, such that the i-th output circuit provides a row of pixel units in the display panel with a gate driving signal through the gate line.

The pull-down control circuit 20 is connected to the first control signal terminal CN, a first reset clock signal terminal RST1, a first power source terminal VGH, a second power source terminal VGL, the pull-up node PUCN and the pull-down node PD, respectively. The pull-down control circuit 20 is used to provide the pull-down node PD with a first power source signal from the first power source terminal VGH under the control of the first control signal and a first reset clock signal from the first reset clock signal terminal RST1, and to provide the pull-down node PD with a second power source signal from the second power source terminal VGL under the control of the pull-up node PUCN. For example, when the first control signal is at the first potential, the first reset clock signal from the first reset clock signal terminal RST1 is at the first potential, and the first power source signal from the first power source terminal VGH is at the first potential, the pull-down control circuit 20 provides the pull-down node PD with the first power source signal at the first potential under the control of the first reset clock signal at the first potential and the first control signal at the effective potential. Optionally, the first power source terminal VGH may be a DC power source terminal.

The pull-down circuit 30 is connected to the second power source terminal VGL, each output terminal, the pull-up node PUCN and the pull-down node PD, respectively. And the pull-down circuit 30 is used to respectively provide each output terminal and the pull-up node PUCN with the second power source signal under the control of the pull-down node PD. For example, when the pull-down node PD is at the first potential and the second power source signal is at the second potential, the pull-down circuit 30 respectively provides each output terminal and the pull-up node PUCN with the second power source signal under the control of the pull-down node PD, so as to reduce noise for each output terminal and the pull-up node PUCN.

Wherein, the N clock signal terminals and the first reset clock signal terminal RST1 can output the clock signal at the first potential sequentially.

In summary, the shift register unit according to the embodiments of the present disclosure includes N output circuits, and each output circuit can provide the i-th output terminal with the i-th clock signal under the control of the pull-up node. Since each output terminal is connected to a gate line, the shift register unit can respectively drive N rows of pixel units through the signals output by the N output circuits. Compared with the related art in which each shift register unit drive one row of pixel units, the number of shift register units in the gate driving circuit can be reduced by adopting the shift register unit according to the embodiments of the present disclosure. And, the layout area occupied by the gate driving circuit in the display device can be effectively reduced, which helps to achieve extra-narrow bezels.

Figure 2:
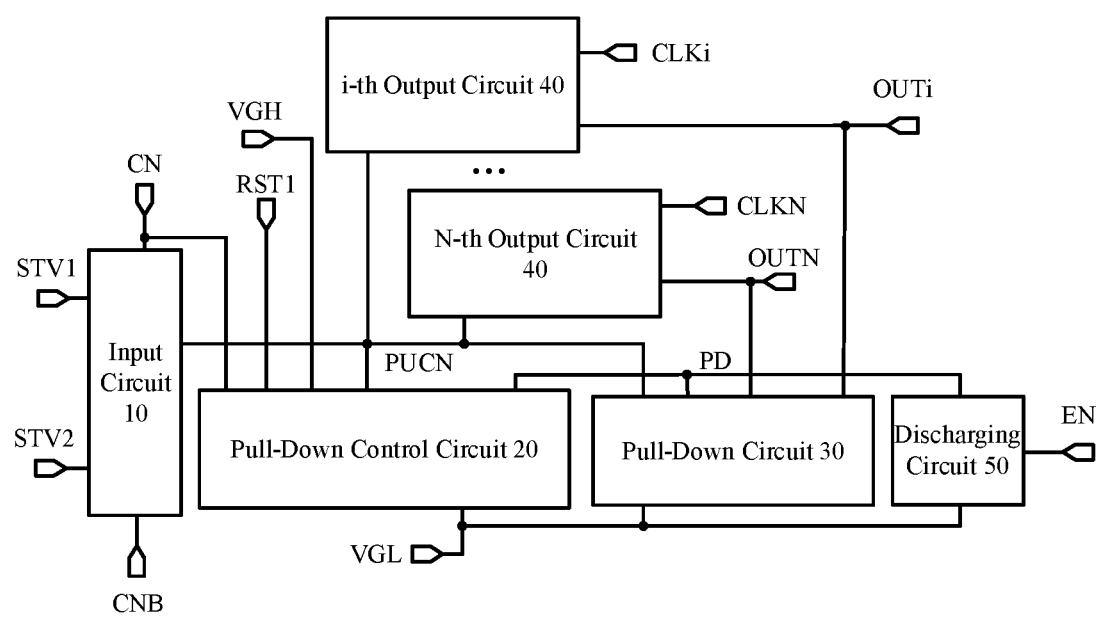
FIG. 2 is a structural schematic diagram of another shift register unit according to an embodiment of the present disclosure.

FIG. 2 is a structural schematic diagram of another shift register unit according to an embodiment of the present disclosure. As shown in FIG. 2, the input circuit 10 may further be connected to the second input signal terminal STV2 and the second control signal terminal CNB such that the gate driving circuit can work in the forward-scanning mode, and can also work in the reverse-scanning mode. When the first control signal output by the first control signal terminal CN is at the first potential and the second control signal output by the second control signal terminal CNB is at the second potential, the gate driving circuit works in the forward-scanning mode. When the first control signal output by the first control signal terminal CN is at the second potential and the second control signal output by the second control signal terminal CNB is at the first potential, the gate driving circuit works in the reverse-scanning mode. Wherein, the forward-scanning mode is a mode of scanning a plurality of rows of pixel units in the display panel in a top-to-bottom order. The reverse-scanning mode is a mode of scanning a plurality of rows of pixel units in the display panel in a bottom-to-top order.

Please continue to refer to FIG. 2, the shift register unit may include: a discharging circuit 50. The discharging circuit 50 is connected to a discharging control terminal EN, the pull-down node PD and the second power source terminal VGL, respectively. And the discharging circuit 50 is used to provide the pull-down node PD with a third power source signal from the second power source terminal VGL under the control of a discharging control signal from the discharging control terminal EN. The third power source signal is at the first potential. That is, the potential of the signal output by the second power source terminal VGL is adjustable. When the display panel needs to be discharged, the signal output by the second power source terminal VGL may be adjusted to be at the first potential, to obtain the third power source signal. When display panel does not need to be discharged, the signal output by the second power source terminal VGL may be adjusted to be at the second potential, to obtain the second power source signal.

Figure 3:
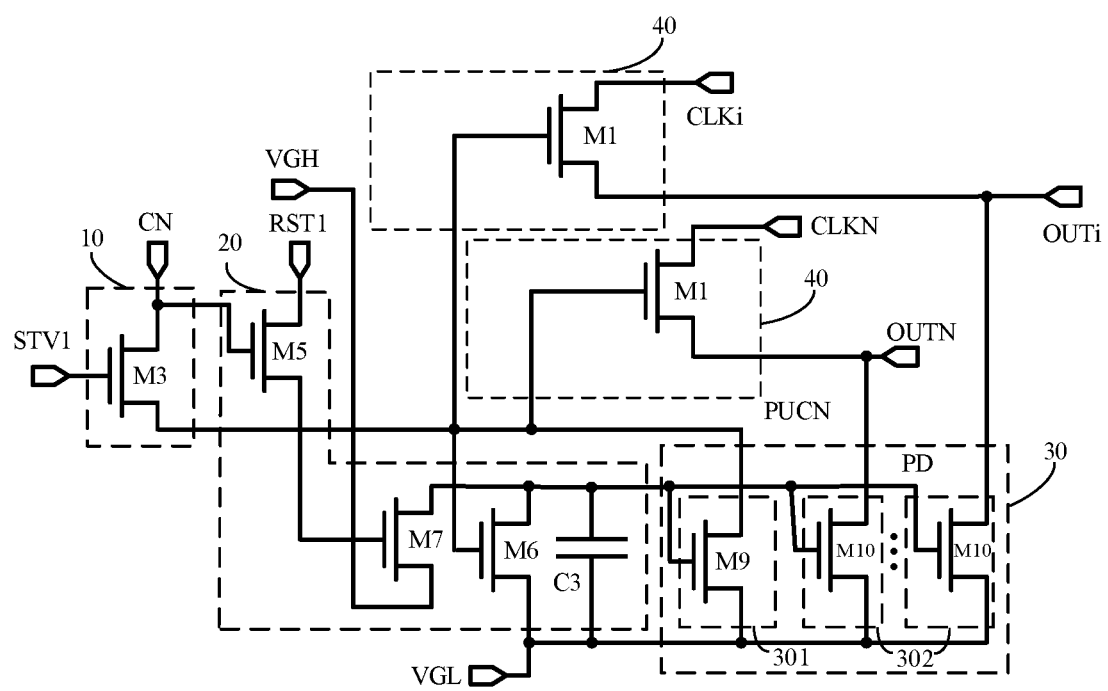
FIG. 3 is a structural schematic diagram of yet another shift register unit according to an embodiment of the present disclosure.

FIG. 3 is a structural schematic diagram of yet another shift register unit according to an embodiment of the present disclosure. As shown in FIG. 3, the i-th output circuit 40 may include: a first transistor M1.

The gate of the first transistor M1 is connected to the pull-up node PUCN, the first electrode of the first transistor M1 is connected to the i-th clock signal terminal CLKi, and the second electrode of the first transistor M1 is connected to the i-th output terminal OUTi. With the arrangement of the i-th output circuit 40, one shift register unit can drive a plurality of rows of pixels, thereby reducing the number of components in the gate driving circuit.

Figure 4:
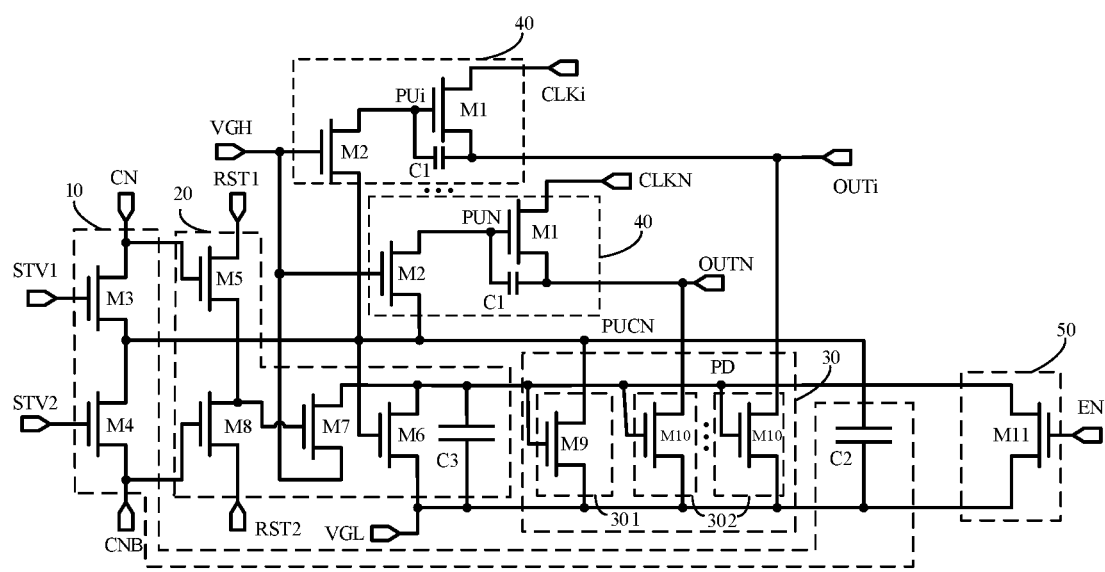
FIG. 4 is a structural schematic diagram of still yet another shift register unit according to an embodiment of the present disclosure.

FIG. 4 is a structural schematic diagram of still yet another shift register unit according to an embodiment of the present disclosure. As shown in FIG. 4, the i-th output circuit 40 may further include: a second transistor M2.

The gate of the second transistor M2 is connected to the first power source terminal VGH, the first electrode of the second transistor M2 is connected to the pull-up node PUCN, and the second electrode of the second transistor M2 is connected to the gate of the first transistor M1. The first electrode of the first transistor M1 is connected to the i-th clock signal terminal CLKi, and the second electrode of the first transistor M1 is connected to the i-th output terminal OUTi. That is, the gate of the first transistor M1 can be connected to the pull-up node PUCN through the second transistor M2. The second transistor M2 is used to ensure the stability of the voltage output by the output circuit 40.

Optionally, as shown in FIG. 4, the i-th output circuit 40 may further include: a first capacitor C1. One terminal of the first capacitor C1 is connected to the gate of the first transistor M1, and the node where they are connected is the pull-up node PUi. The other terminal of the first capacitor C1 is connected to the second electrode of the first transistor M1. Due to the coupling effect of the capacitor, the first capacitor C1 can further increase the voltage of the gate of the first transistor M1 when the i-th clock signal from the i-th clock signal terminal is at the first potential, so that the first transistor M1 maintains to be turned on during the process when the i-th clock signal is at the first potential, so as to ensure the stable output of the i-th output circuit 40.

Please referring to FIG. 3 and FIG. 4, the input circuit 10 may include: a third transistor M3. The gate of the third transistor M3 is connected to the first input signal terminal STV1, the first electrode of the third transistor M3 is connected to the first control signal terminal CN, and a second electrode of the third transistor M3 is connected to the pull-up node PUCN.

As shown in FIG. 4, the input circuit 10 may further include: a second capacitor C2. One terminal of the second capacitor C2 is connected to the pull-up node PUCN and the other terminal of the second capacitor C2 is connected to the second power source terminal VGL. The second capacitor C2 is used to stabilize the voltage of the pull-up node PUCN.

In addition, as shown in FIG. 4, the input circuit 10 is further connected to the second input signal terminal STV2 and the second control signal terminal CNB. Correspondingly, the input circuit 10 may further include: a fourth transistor M4.

The gate of the fourth transistor M4 is connected to the second input signal terminal STV2, the first electrode of the fourth transistor M4 is connected to the second control signal terminal CNB, and the second electrode of the fourth transistor M4 is connected to the pull-up node PUCN. When the first control signal output by the first control signal terminal CN is at the second potential, and the second control signal output by the second control signal CNB is at the first potential, this structure is used to control the gate driving circuit to work in the reverse-scanning mode. Therefore, this structure ensures that the gate driving circuit can work in the forward-scanning mode and can also work in the reverse-scanning mode.

Please continue to refer to FIG. 3 and FIG. 4, the pull-down control circuit 20 includes: a fifth transistor M5, a sixth transistor M6, a seventh transistor M7 and a third capacitor C3.

The gate of the fifth transistor M5 is connected to the first control signal terminal CN, the first electrode of the fifth transistor M5 is connected to the first reset clock signal terminal RST1, and the second electrode of the fifth transistor M5 is connected to the gate of the seventh transistor M7.

The gate of the sixth transistor M6 is connected to the pull-up node PUCN, the first electrode of the sixth transistor M6 is connected to the second power source terminal VGL, and the second electrode of the sixth transistor M6 is connected to the pull-down node PD.

The first electrode of the seventh transistor M7 is connected to the first power source signal terminal VGH, and the second electrode of the seventh transistor M7 is connected to the pull-down node PD.

One terminal of the third capacitor C3 is connected to the pull-down node PD and the other terminal of the third capacitor C3 is connected to the second power source terminal VGL. The third capacitor C3 is used to stabilize the voltage of the pull-down node PD.

Furthermore, as shown in FIG. 4, the pull-down control circuit 20 is further connected to a second reset clock signal terminal RST2 and a second control signal terminal CNB. Correspondingly, the pull-down control circuit 20 further includes: an eighth transistor M8.

The gate of the eighth transistor M8 is connected to the second control signal terminal CNB, the first electrode of the eighth transistor M8 is connected to the second reset clock signal terminal RST2, and the second electrode of the eighth transistor M8 is connected to the gate of the seventh transistor M7. Wherein, the second reset clock signal terminal RST2, the N clock signal terminals and the first reset clock signal terminal RST1 can sequentially output the clock signal at the first potential.

Please continue to refer to FIG. 3 and FIG. 4, the pull-down circuit 30 may include: a first pull-down sub-circuit 301 and N second pull-down sub-circuits 302.

The first pull-down sub-circuit 301 is connected to the pull-down node PD, the second power source terminal VGL and the pull-up node PUCN, respectively. And the first pull-down sub-circuit 301 is used to provide the pull-up node PUCN with the second power source signal under the control of the pull-down node PD.

The i-th second pull-down sub-circuit of the N second pull-down sub-circuits is connected to the pull-down node PD, the second power source terminal VGL and the i-th output terminal OUTi, respectively. The i-th second pull-down sub-circuit is used to provide the i-th output terminal OUTi with the second power source signal under the control of the pull-down node PD. The arrangement of N second pull-down sub-circuits can ensure the noise-reducing function for the N output terminals.

Wherein, the first pull-down sub-circuit may include: a ninth transistor M9. The gate of the ninth transistor M9 is connected to the pull-down node PD, the first electrode of the ninth transistor M9 is connected to the second power source terminal VGL and the second electrode of the ninth transistor M9 is connected to the pull-up node PUCN.

Among the N second pull-down sub-circuits 302, the i-th second pull-down sub-circuit may include: a tenth transistor M10. The gate of the tenth transistor M10 is connected to the pull-down node PD, the first electrode of the tenth transistor M10 is connected to the second power source terminal VGL and the second electrode of the tenth transistor M10 is connected to the i-th output terminal OUTi.

Please continue to refer to FIG. 4, the discharging circuit 50 may include: an eleventh transistor M11. The gate of the eleventh transistor M11 is connected to the discharging control terminal EN, the first electrode of the eleventh transistor M11 is connected to the second power source terminal VGL, and the second electrode of the eleventh transistor M11 is connected to the pull-down node PD. During the discharging process of the display panel, the second power source terminal VGL outputs a third power source signal at the first potential. The eleventh transistor M11 is turned on under the control of the discharging control signal output by the discharging control terminal EN. The discharging circuit 50 can provide the pull-down node PD with the third power source signal at the first potential through the eleventh transistor M11, to enable the pull-down circuit 30 to start working, so as to reduce noise for the pull-up node PUCN and each output terminal, such that all rows of pixels in the display panel are in a dark state, thereby the display panel is discharged. For example, the discharging control terminal EN may be controlled to output the discharging control signal at the first potential when the display panel is abnormally powered off or after a frame of image has been scanned, to enable the pull-down circuit 30 to start working, such that the display panel is discharged.

In summary, the shift register unit according to the embodiments of the present disclosure includes N output circuits, and each output circuit can provide the i-th output terminal with the i-th clock signal under the control of the pull-up node. Since each output terminal is connected to a gate line, the shift register unit can respectively drive N rows of pixel units through the signals output by the N output circuits, compared with the related art in which each shift register unit drive one row of pixel units, the number of shift register units in the gate driving circuit can be reduced by adopting the shift register unit according to the embodiments of the present disclosure. And, the layout area occupied by the display device in the gate driving circuit can be effectively reduced, which helps to achieve extra-narrow bezel.

Figure 5:
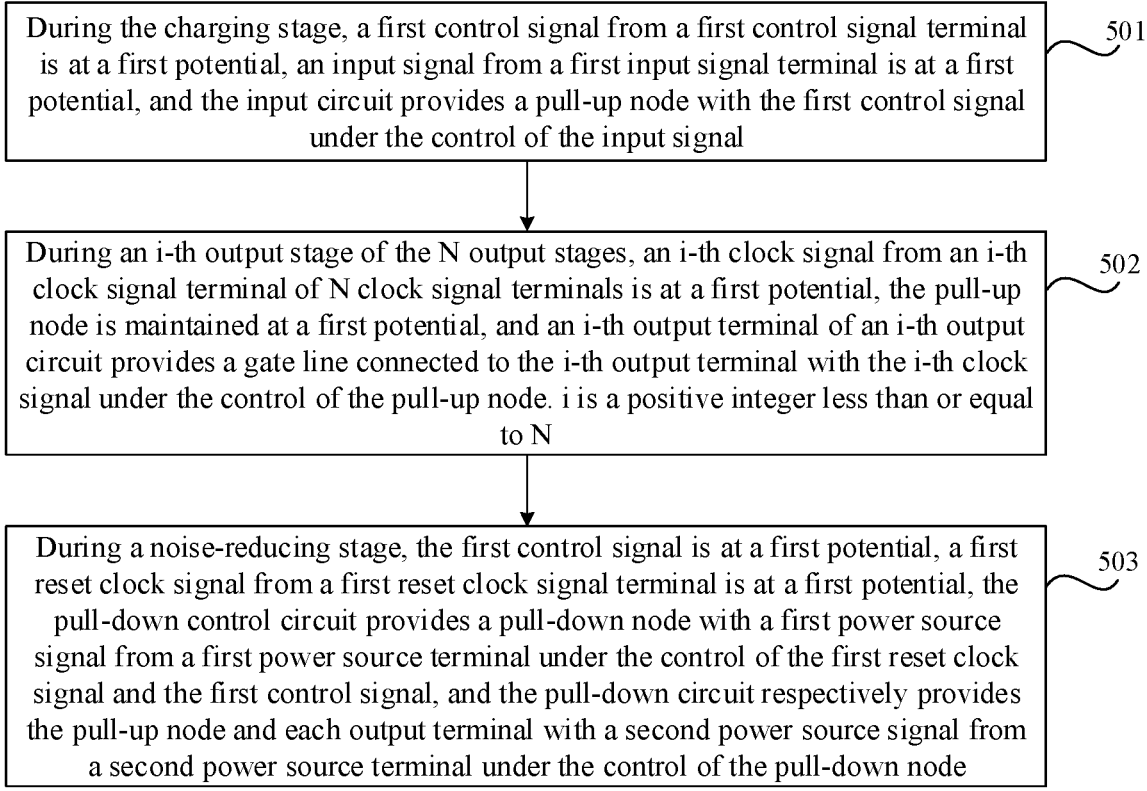
FIG. 5 is a flowchart of a driving method for a shift register unit according to an embodiment of the present disclosure.

FIG. 5 is a flowchart of a driving method for a shift register unit according to an embodiment of the present disclosure. This method may be applied to drive the shift register unit according to any one of FIG. 1 to FIG. 4. Referring to FIG. 1, the shift register unit may include: an input circuit 10, a pull-down control circuit 20, a pull-down circuit 30 and N output circuits 40. The method may include: a charging stage, N output stages and a noise-reducing stage. Specifically, the working processes are as follows.

In step 501, during the charging stage, a first control signal from a first control signal terminal is at a first potential, an input signal from a first input signal terminal is at a first potential, and the input circuit provides a pull-up node with the first control signal under the control of the input signal.

In step 502, during an i-th output stage of the N output stages, an i-th clock signal from an i-th clock signal terminal of N clock signal terminals is at a first potential, the pull-up node is maintained at a first potential, and an i-th output terminal of an i-th output circuit provides a gate line connected to the i-th output terminal with the i-th clock signal under the control of the pull-up node. i is a positive integer less than or equal to N.

In step 503, during a noise-reducing stage, the first control signal is at a first potential, a first reset clock signal from a first reset clock signal terminal is at a first potential, the pull-down control circuit provides a pull-down node with a first power source signal from a first power source terminal under the control of the first reset clock signal and the first control signal, and the pull-down circuit respectively provides the pull-up node and each output terminal with a second power source signal from a second power source terminal under the control of the pull-down node.

Here, the N clock signal terminals and the first reset clock signal terminal outputs the clock signal at a first potential sequentially. And, the first power source signal is at a first potential and the second power source signal is at a second potential.

Optionally, the driving method for the shift register unit may further include that the pull-down control circuit provides the pull-down node with the second power source signal from the second power source terminal under the control of the pull-up node in step 501 and step 502.

In addition, the driving method for the shift register unit may further include a discharging stage. In the discharging stage, a discharging control signal from a discharging control terminal is at a first potential, a third power source signal from the second power source terminal is at a first potential, and the discharging circuit provides the pull-down node with the third power source signal under the control of the discharging control signal. The third power source signal is at a first potential. Under the control of the third power source signal, the potential of the pull-down node changes to a first potential. The pull-down circuit starts working under the control of the pull-down node at a first potential, and reduces noise for the pull-up node and each output terminal, thereby discharging the display panel. For example, as shown in FIG. 4, the discharging circuit 50 includes an eleventh transistor M11. The eleventh transistor M11 is turned on under the control of the discharging control signal at a first potential. In this case, the second power source terminal can provide the pull-down node PD with the third power source signal at an effective potential through the eleventh transistor M11, to enable the pull-down node PD to be at an effective potential, and to enable the pull-down circuit 30 to work under the control of the pull-down node PD, thereby discharging the display panel.

In summary, the driving method for the shift register unit according to the embodiments of the present disclosure includes a charging stage, N output stages and a noise-reducing stage. The signals output by the shift register unit during each output stage of the N output stages can drive one row of pixel units. Compared with the related art in which each shift register unit drive one row of pixel units when each shift register unit is driving, when the driving method for the shift register unit according to the embodiments of the present disclosure is adopted to drive each shift register unit, the signals output by the shift register unit can drive N rows of pixel units. And, the driving method for the shift register unit can bring a relatively high driving efficiency.

Figure 6:
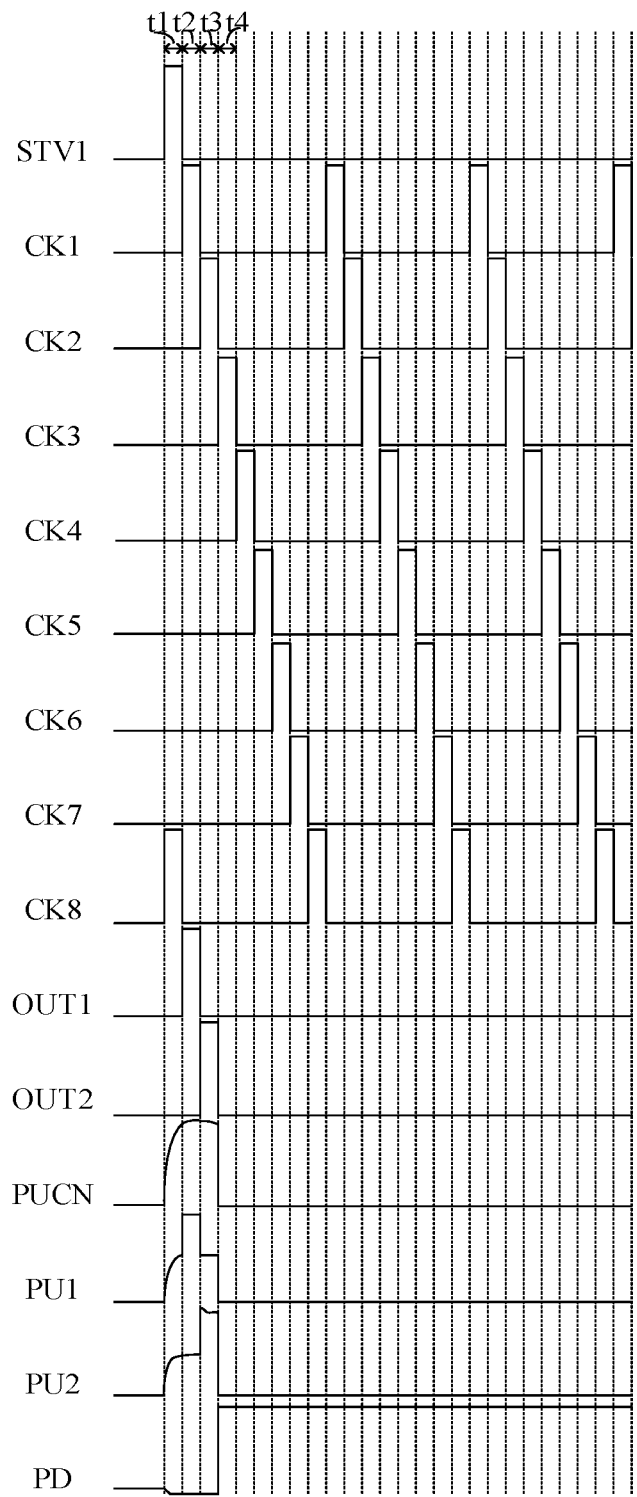
FIG. 6 is a timing sequence diagram illustrating a driving process for a shift register unit according to an embodiment of the present disclosure.

FIG. 6 is a timing sequence diagram illustrating a driving process for a shift register unit according to an embodiment of the present disclosure. The driving principle of a shift register unit provided in the embodiment of the present disclosure is described in detail by taking an example in which the shift register unit shown in FIG. 4 includes two output circuits 40, the first control signal maintains at a high potential (for example, may be 8V), the second control signal maintains at a low potential (for example, may be −8V), each transistor in the shift register unit is an N-type transistor and each shift register unit is connected to four clock signal terminals.

Referring to FIG. 6, during the charging stage t1, the first control signal from the first control signal terminal CN is at the high potential, the input signal from the first input signal terminal STV is at the high potential, and the clock signals output from all clock signal terminals are all at the low potential. In this case, the third transistor M3 is turned on under the control of the input signal, and the first control signal terminal CN outputs the first control signal to the pull-up node PUCN through the third transistor M3, to charge the pull-up node PUCN. Furthermore, as the first power source signal output from the first power source terminal VGH is at the high potential and the gate of the second transistor M2 is connected to the first power source terminal VGH, the second transistor M2 is turned on and the pull-up node PUCN provides the first sub-pull-up node PU1 with a signal through the second transistor M2 in the first output circuit, and provides the second sub-pull-up node PU2 with a signal through the second transistor M2 in the second output circuit, to charge the sub-pull-up node PU1 and the second sub-pull-up node PU2, such that the potentials of the sub-pull-up node PU1 and the second sub-pull-up node PU2 rise to a certain degree. The first transistors M1 in the two output circuits are turned on, the first clock signal terminal CLK1 provides the first output terminal OUT1 with the first clock signal CK1 at the second potential, and the second clock signal terminal CLK2 provides the second output terminal OUT2 with the second clock signal CK2 at the second potential. And since the pull-up node PUCN is at the high potential, the sixth transistor M6 is enabled to be turned on, and the second power source terminal VGL provides the pull-down node PD with the second power source signal at the low potential through the sixth transistor M6, such that all transistors in the pull-down circuit 30 are turned off.

During the first output stage t2, the first clock signal CK1 output from the first clock signal terminal CLK1 is at the high potential, the clock signals output from other clock signal terminals are at the low potential, and the pull-up node PUCN is maintained at the high potential. As the potential of the first sub-pull-up node PU1 rises to a certain degree during the charging stage t1, the first transistor M1 in the first output circuit is lightly turned on under the control of the first sub-pull-up node PU1, and the first clock signal terminal CLK1 provides the second electrode of the first transistor M1 with the first clock signal CK1. After the first clock signal CK1 jumps to the high potential in the first output stage t2, the potential of the first sub-pull-up node PU1 rises further with the rise of the potential of second electrode of the first transistor M1 due to the coupling effect of the first capacitor C, to enable the potential of the first sub-pull-up node PU1 to be approximately equal to the potential of the pull-up node PUCN. In this case, the first transistor M1 is completely turned on, and the first clock signal terminal CLK1 provides the first output terminal OUT1 with the first clock signal CK1 at the high potential, to enable the first output terminal OUT1 to provide the gate line connected to the first output terminal OUT1 with the gate driving signal which is used to drive the pixel units in the display panel.

During the second output stage t3, the second clock signal CK2 output from the second clock signal terminal CLK2 is at the high potential, the clock signals output from other clock signal terminals are at the low potential, and the pull-up node PUCN is maintained at the high potential. As the potential of the second sub-pull-up node PU2 rises to a certain degree during the charging stage t1, the first transistor M1 in the second output circuit is lightly turned on under the control of the second sub-pull-up node PU1, and the second clock signal terminal CLK2 provides the second electrode of the first transistor M1 with the second clock signal CK2. After the second clock signal CK2 jumps to the high potential in the second output stage t3, the potential of the second sub-pull-up node PU2 rises further with the rise of the potential of second electrode of the first transistor M1 due to the coupling effect of the first capacitor C, to enable the potential of the second sub-pull-up node PU2 to be approximately equal to the potential of the pull-up node PUCN. In this case, the first transistor M1 is completely turned on, and the second clock signal terminal CLK2 provides the second output terminal OUT2 with the second clock signal CK2 at the high potential, to enable the second output terminal OUT2 to provide the gate line connected to the second output terminal OUT2 with the gate driving signal which is used to drive the pixel units in the display panel.

During the first output stage t2 and the second output stage t3, as the pull-up node PUCN is at the high potential, the sixth transistor M6 is enabled to be turned on, to enable the second power source terminal VGL to provide the pull-down node PD with the second power source signal at the low potential, such that the transistors in the pull-down circuit 30 are turned off. Thus, the potentials of the pull-up node PUCN, the first output terminal OUT1 and the second output terminal OUT2 are avoided from being affected and the stability of the signals output from the shift register unit is ensured.

Additionally, during the first output stage t2 and the second output stage t3, after the potentials of the first sub-pull-up node PU1 and the second sub-pull-up node PU2 rise further, the potentials may be approximately equal to the potential of the pull-up node PUCN, to enable the first electrode and the second electrode of each second transistor M2 to be at the high potential. Thus, the leakage current of the second transistor M2 is avoided from affecting the potential of the pull-up node PUCN, which further ensures the stability of the signals output from the shift register unit.

It should be noted that during the first output stage t2 and the second output stage t3, as the first transistor M1 has a relatively wide channel, the first transistor M1 also has a certain coupling effect. Therefore, even though the first capacitor C1 is not disposed in the shift register unit, the potentials of the first sub-pull-up node PU1 and the second sub-pull-up node PU2 will also rise further with the rise of the second electrode of the first transistor M1.

During the noise-reducing stage, the first control signal output from the first control signal terminal CN is at the high potential, the first power source signal output from the first power source terminal VGH is at the high potential, the first reset clock signal CK3 output from the first reset clock signal terminal RST1 is at the high potential, and the clock signals output from other clock signal terminals are at the low potential. Under the control of the first control signal at the high potential, the fifth transistor M5 is turned on, and the first reset clock signal terminal RST1 provides the gate of the seventh transistor M7 with the first reset clock signal CK3 at the high potential through the fifth transistor M5, to enable the seventh transistor M7 to be turned on. The first power source terminal VGH provides the pull-down node PD with the first power source signal at the high potential through the seventh transistor M7. The ninth transistor M9 and the tenth transistor M10 are turned on under the drive of the pull-down node PD. In this case, the second power source terminal VGL can provide the pull-up node PUCN with the second power source signal at the low potential through the ninth transistor M9, and can provide the first output terminal OUT1 with the second power source signal at the low potential through a tenth transistor M10, and can provide the second output terminal OUT2 with the second power source signal at the low potential through another tenth transistor M10, so as to reduce noise for the pull-up node PUCN, the first output terminal OUT1 and the second output terminal OUT2.

It can be seen from FIG. 6 that the potential of the pull-up node PUCN will be pulled down during the noise-reducing stage. That is, the potential of the pull-up node PUCN only needs to be maintained for three pulse durations of the clock signal. However, in the related art, the potential of the pull-up node PUCN is pulled down when the next shift register unit outputs. Compared with the related art, the driving method for the shift register unit in the embodiments of the present disclosure reduces the maintaining time of the potential of the pull-up node PUCN, which can avoid occurrence of some obstinate defects on the display panel and guarantee the product quality.

Optionally, the specific potentials of the signals from the power source terminals and the signal terminals may be adjusted based on the actual requirements of the circuit. For example, the potential of the first power source signal may be 8V, the potential of the second power source signal may be −8V, and the potential of each clock signal may also be 8V, which is not limited in the embodiments of the present disclosure.

It should be noted that the above embodiments are described by taking an example in which the transistors are N-type transistors, and the first potential is a high potential relative to the second potential. Certainly, the above transistors may also be P-type transistors. When the above transistors are P-type transistors, the first potential may be a low potential relative to the second potential, and the potential change of each signal terminal may be opposite to that as shown in FIG. 6.

In summary, the driving method for the shift register unit according to the embodiments of the present disclosure includes a charging stage, N output stages and a noise-reducing stage. The signals output by the shift register unit during each output stage of the N output stages can drive one row of pixel units. Compared with the related art, in which each shift register unit drive one row of pixel units when each shift register unit is driving, when the driving method for the shift register unit according to the embodiments of the present disclosure is adopted to drive each shift register unit, the signals output by the shift register unit can drive N rows of pixel units. Thus, the driving efficiency of the driving method for the shift register unit can be effectively improved.

Figure 7:
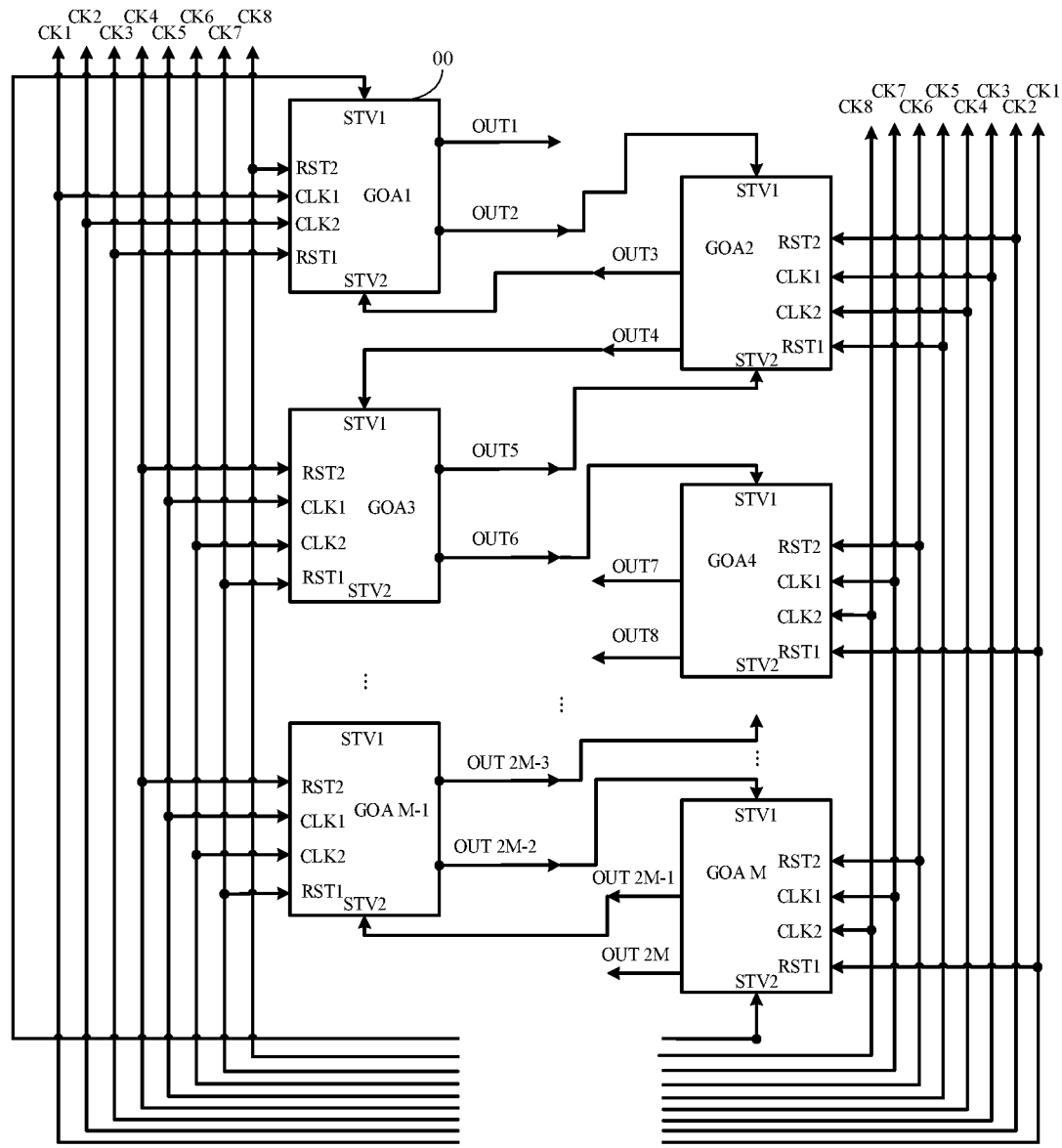
FIG. 7 is a structural schematic diagram of a gate driving circuit according to an embodiment of the present disclosure.

FIG. 7 is a structural schematic diagram of a gate driving circuit according to an embodiment of the present disclosure. As shown in FIG. 7, the gate driving circuit may include M cascaded shift register units 00, where M is an integer greater than 1. Each shift register unit 00 may be the shift register unit as shown in any one of FIG. 1 to FIG. 4. Among the M shift register units 00, the N-th output terminal of the j-th shift register unit is connected to the first input signal terminal STV1 of the (j+1)-th shift register unit, where j is a positive integer less than M.

Optionally, the M shift register units 00 may include two groups of shift register units which may be at two sides facing each other on the display panel, respectively. For example, among the M shift register units, the odd number levels of shift register units, such as the first level of shift register unit, the third level of shift register unit and the fifth level of shift register unit, may be at the first side (for example, the left side) of the display panel. That is, (2×p−1)-th shift register units are at the first side of the display panel. Among the M shift register units, the even number levels of shift register units, such as the second level of shift register unit, the fourth level of shift register unit and the sixth level of shift register unit, may be at the second side (for example, the right side) of the display panel. That is, (2×p)-th shift register units are at the second side of the display panel. The first side and the second side are two side facing each other on the display panel, and p is a positive integer no greater than M/2. By arranging the two groups of shift register units at two sides facing each other on the display panel, respectively, the distribution density of the components in the display panel can be reduced, and that the TFTs are disposed in a relatively evenly distributed state in the display panel can be ensured, thereby improving the partial heating of the display panel.

Additionally, when the odd number levels of shift register units are at the first side of the display panel and the even number levels of shift register units are at the second side of the display pane, among the M shift register units, the N-th output terminal of the j-th shift register unit may be connected to the first input signal terminal STV1 of the (j+1)-th shift register unit, thereby reducing the amount of lines in the display panel.

It should be noted that the gate driving circuit shown in FIG. 7 includes M shift register units, which are the first level of shift register unit GOA1, the second level of shift register unit GOA2, the third level of shift register unit GOA3, . . . , the (M−1)-th level of shift register unit GOA M−1 and the M-th level of shift register unit GOA M, respectively. In the forward-scanning mode, GOA1, GOA2, GOA3, . . . , GOA M−1 and GOA M output the gate driving signals sequentially, and the N-th output terminal of the j-th shift register unit is connected to the first input signal terminal STV1 of the (j+1)-th shift register unit, where j is a positive integer less than M. In the reverse-scanning mode, GOA M, GOA M−1, . . . , GOA3, GOA2 and GOA1 output the gate driving signals sequentially, and the first output terminal of the k-th level shift register unit is connected to the second input signal terminal STV2 of the (k−1)-th level shift register unit, where k is a positive integer greater than 1 and less than or equal to M.

When the M shift register units work in the forward-scanning mode, in each shift register unit, the N clock signal terminals corresponding to the N output circuits 40 output the clock signals at the first potential sequentially from the first clock signal terminal to the N-th clock signal terminal, to enable the output circuits from the first output circuit 40 to the N-th output circuit 40 to output the gate driving signals sequentially. When the M shift register units work in the reverse-scanning mode, in each shift register unit, the N clock signal terminals corresponding to the N output circuits 40 output the clock signals at the first potential sequentially from the N-th clock signal terminal to the first clock signal terminal, to enable the output circuits from the N-th output circuit 40 to the first output circuit 40 to output the gate driving signals sequentially.

In summary, among the M shift register units in the gate driving circuit according to the embodiments of the present disclosure, the N-th output terminal of the j-th shift register unit is connected to the first input signal terminal STV1 of the (j+1)-th shift register unit, such that the output from the previous level of shift register unit can be serve as the input signal for the next level of shift register unit, which can effectively reduce the number of the input signal terminals, and thus lower down the driving power consumption of the shift register unit and help to achieve extra-narrow bezel.

Furthermore, when the shift register unit includes two output circuits, eight clock signal terminals may be disposed in the gate driving circuit. The eight clock signal terminals output clock signals CK1 to CK8, respectively. As shown in FIG. 6, the duty ratio of each of the eight clock signals is one eighth, and the clock signals at the high potential can be output sequentially. Please refer to FIG. 7, the clock signal input to the first clock signal terminal CLK1 of the first level of shift register unit GOA1 may be CK1, the clock signal input to the second clock signal terminal CLK2 may be CK2, the clock signal input to the first reset clock signal terminal RST1 may be CK3, and the clock signal input to the second reset clock signal terminal RST2 may be CK8. As shown in FIG. 6, the clock signals CK8, CK1, CK2 and CK3 are sequentially at high potentials. The clock signal input to the first clock signal terminal CLK1 of the second level of shift register unit GOA2 may be CK3, the clock signal input to the second clock signal terminal CLK2 may be CK4, the clock signal input to the first reset clock signal terminal RST1 may be CK5, and the clock signal input to the second reset clock signal terminal RST2 may be CK2. The clock signals CK2, CK3, CK4 and CK5 are sequentially at high potentials. The clock signal input to the first clock signal terminal CLK1 of the third level of shift register unit GOA3 may be CK5, the clock signal input to the second clock signal terminal CLK2 may be CK6, the clock signal input to the first reset clock signal terminal RST1 may be CK7, and the clock signal input to the second reset clock signal terminal RST2 may be CK4. The clock signals CK4, CK5, CK6 and CK7 are sequentially at high potentials. The clock signal input to the first clock signal terminal CLK1 of the fourth level of shift register unit GOA4 may be CK7, the clock signal input to the second clock signal terminal CLK2 may be CK8, the clock signal input to the first reset clock signal terminal RST1 may be CK1, and the clock signal input to the second reset clock signal terminal RST2 may be CK6. The clock signals CK6, CK7, CK8 and CK1 are sequentially at high potentials. The gate driving circuit may repeat the above connection in units of every four shift register units.

Figure 8:
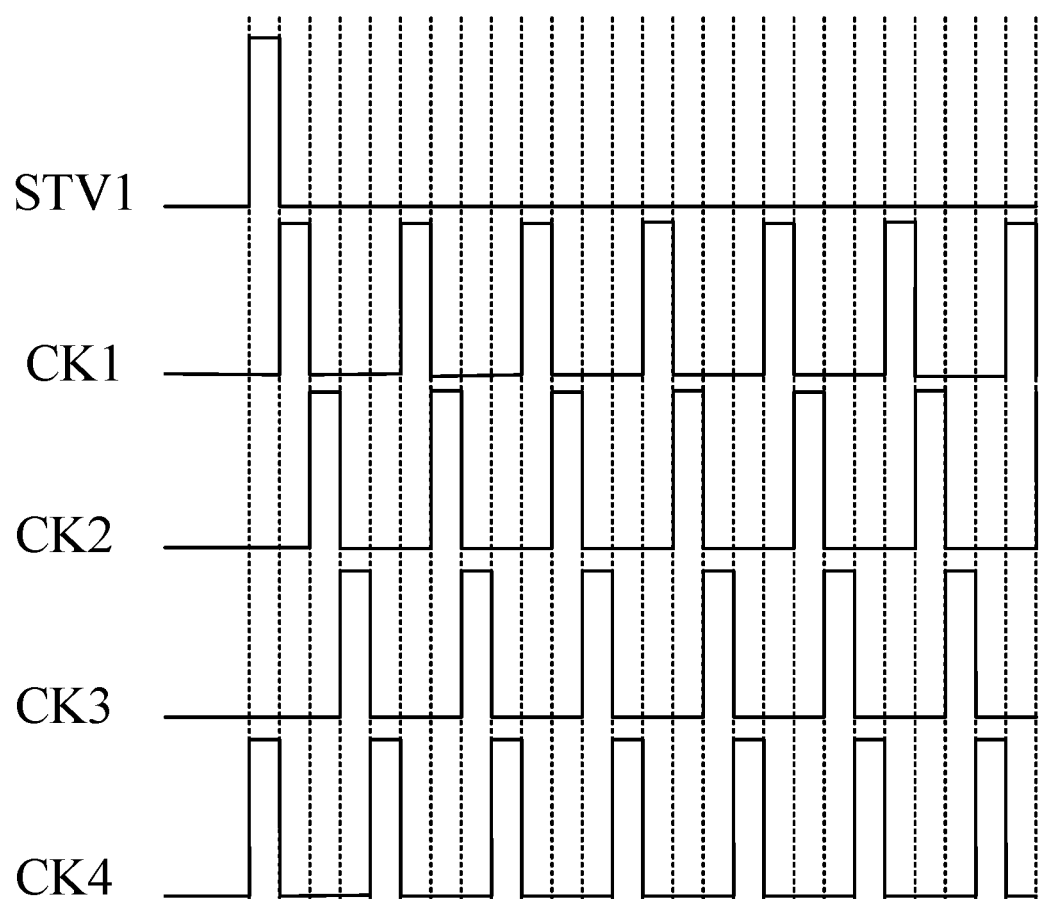
FIG. 8 is a timing sequence diagram illustrating a driving process for another shift register unit according to an embodiment of the present disclosure.

Alternatively, four clock signal terminals may be disposed in the gate driving circuit. The four clock signal terminals output clock signals CK1 to CK4, respectively. As shown in FIG. 8, the duty ratio of each of the four clock signals is one fourth, and the clock signals may be at the high potentials sequentially. Exemplarily, the clock signal input to the first clock signal terminal CLK1 of the first level of shift register unit GOA1 may be CK1, the clock signal input to the second clock signal terminal CLK2 may be CK2, and the clock signal input to the first reset clock signal terminal RST1 may be CK3. The clock signal input to the first clock signal terminal CLK1 of the second level of shift register unit GOA2 may be CK3, the clock signal input to the second clock signal terminal CLK2 may be CK4, and the clock signal input to the first reset clock signal terminal RST1 may be CK1. The gate driving circuit may repeat the above connection in units of every two shift register units. Thus, the amount of the clock signal terminals may be reduced and thus the cost of the display panel may be reduced.

It should be noted that, according to the actual requirement, sixteen clock signal terminals may be disposed in the gate driving circuit, which is not limited in the embodiments of the present disclosure.

The embodiments of the present disclosure provide a display panel, which may include the gate driving circuit as shown in FIG. 7. The display device may be any products or components with a display function, such as a liquid crystal panel, an electronic paper, an Organic Light-Emitting Diode (OLED) panel, a mobile phone, a tablet computer, a TV, a display, a laptop computer, a digital photo frame, a navigator, etc.

The embodiments of the present disclosure further provide a storage medium. Computer programs are stored on the storage medium, and the computer programs implements the driving method of the shift register unit provided in the embodiments of the present disclosure when executed by a processor.

The foregoing descriptions are merely exemplary embodiments of the present disclosure, and are not intended to limit the present disclosure. Within the spirit and principles of the disclosure, any modifications, equivalent substitutions, improvements, etc., are within the protection scope of the appended claims of the present disclosure.

What is claimed is:

1. A shift register unit, comprising:
   an input circuit respectively connected to a first input signal terminal, a first control signal terminal and a pull-up node, and used to provide the pull-up node with a first control signal from the first control signal terminal under control of an input signal from the first input signal terminal;
   N output circuits, wherein an i-th output circuit is respectively connected to an i-th clock signal terminal of N clock signal terminals, the pull-up node and an i-th output terminal of N output terminals, and is used to provide the i-th output terminal with an i-th clock signal from the i-th clock signal terminal under control of the pull-up node, wherein each output terminal of the N output terminals is connected to one gate line, N is an integer greater than or equal to 2, and i is positive integer less than or equal to N;
   a pull-down control circuit respectively connected to the first control signal terminal, a first reset clock signal terminal, a first power source terminal, a second power source terminal, the pull-up node and a pull-down node, and used to provide the pull-down node with a first power source signal from the first power source terminal under control of the first control signal and a first reset clock signal from the first reset clock signal terminal, and to provide the pull-down node with a second power source signal from the second power source terminal under control of the pull-up node; and
   a pull-down circuit respectively connected to the second power source terminal, each output terminal, the pull-up node and the pull-down node, and used to respectively provide each output terminal and the pull-up node with the second power source signal under control of the pull-down node.

2. The shift register unit according to claim 1, wherein the i-th output circuit comprises: a first transistor;
   wherein a gate of the first transistor is connected to the pull-up node, a first electrode of the first transistor is connected to the i-th clock signal terminal, and a second electrode of the first transistor is connected to the i-th output terminal.

3. The shift register unit according to claim 2, wherein the i-th output circuit further comprises: a second transistor;
   wherein a gate of the second transistor is connected to the first power source terminal, a first electrode of the second transistor is connected to the pull-up node, and a second electrode of the second transistor is connected to the gate of the first transistor.

4. The shift register unit according to claim 1, wherein the input circuit comprises: a third transistor;
   wherein a gate of the third transistor is connected to the first input signal terminal, a first electrode of the third transistor is connected to the first control signal terminal, and a second electrode of the third transistor is connected to the pull-up node.

5. The shift register unit according to claim 4, wherein the input circuit is further connected to a second input signal terminal and a second control signal terminal; and
the input circuit further comprises: a fourth transistor;
wherein a gate of the fourth transistor is connected to the second input signal terminal, a first electrode of the fourth transistor is connected to the second control signal terminal, and a second electrode of the fourth transistor is connected to the pull-up node.

6. The shift register unit according to claim 1, wherein the pull-down control circuit comprises: a fifth transistor, a sixth transistor and a seventh transistor;
wherein a gate of the fifth transistor is connected to the first control signal terminal, a first electrode of the fifth transistor is connected to the first reset clock signal terminal, and a second electrode of the fifth transistor is connected to a gate of the seventh transistor;
a gate of the sixth transistor is connected to the pull-up node, a first electrode of the sixth transistor is connected to the second power source terminal, and a second electrode of the sixth transistor is connected to the pull-down node; and
a first electrode of the seventh transistor is connected to the first power source signal terminal, and a second electrode of the seventh transistor is connected to the pull-down node.

7. The shift register unit according to claim 6, wherein the pull-down control circuit is further connected to a second reset clock signal terminal and a second control signal terminal; and
the pull-down control circuit further comprises: an eighth transistor;
wherein a gate of the eighth transistor is connected to the second control signal terminal, a first electrode of the eighth transistor is connected to the second reset clock signal terminal, and a second electrode of the eighth transistor is connected to the gate of the seventh transistor.

8. The shift register unit according to claim 1, wherein the pull-down circuit comprises:
a first pull-down sub-circuit respectively connected to the pull-down node, the second power source terminal and the pull-up node, and used to provide the pull-up node with the second power source signal under control of the pull-down node; and
N second pull-down sub-circuits, wherein an i-th second pull-down sub-circuit is respectively connected to the pull-down node, the second power source terminal and the i-th output terminal, and used to provide the i-th output terminal with the second power source signal under control of the pull-down node.

9. The shift register unit according to claim 8, wherein the first pull-down sub-circuit comprises: a ninth transistor;
wherein a gate of the ninth transistor is connected to the pull-down node, a first electrode of the ninth transistor is connected to the second power source terminal, and a second electrode of the ninth transistor is connected to the pull-up node.

10. The shift register unit according to claim 8, wherein an i-th second pull-down sub-circuit comprises: a tenth transistor;
wherein a gate of the tenth transistor is connected to the pull-down node, a first electrode of the tenth transistor is connected to the second power source terminal, and a second electrode of the tenth transistor is connected to the i-th output terminal.

11. The shift register unit according to claim 1, further comprising:
a discharging circuit respectively connected to a discharging control terminal, the pull-down node and the second power source terminal, and used to provide the pull-down node with a third power source signal from the second power source terminal under control of a discharging control signal from the discharging control terminal.

12. The shift register unit according to claim 11, wherein the discharging circuit comprises: an eleventh transistor;
wherein a gate of the eleventh transistor is connected to the discharging control terminal, a first electrode of the eleventh transistor is connected to the second power source terminal, and a second electrode of the eleventh transistor is connected to the pull-down node.

13. The shift register unit according to claim 1, wherein the i-th output circuit comprises: a first transistor, the input circuit comprises: a third transistor, the pull-down control circuit comprises: a fifth transistor, a sixth transistor and a seventh transistor, and the pull-down circuit comprises: a ninth transistor and N tenth transistors,
wherein a gate of the first transistor is connected to the pull-up node, a first electrode of the first transistor is connected to the i-th clock signal terminal, and a second electrode of the first transistor is connected to the i-th output terminal;
a gate of the third transistor is connected to the first input signal terminal, a first electrode of the third transistor is connected to the first control signal terminal, and a second electrode of the third transistor is connected to the pull-up node;
a gate of the fifth transistor is connected to the first control signal terminal, a first electrode of the fifth transistor is connected to the first reset clock signal terminal, and a second electrode of the fifth transistor is connected to a gate of the seventh transistor;
a gate of the sixth transistor is connected to the pull-up node, a first electrode of the sixth transistor is connected to the second power source terminal, and a second electrode of the sixth transistor is connected to the pull-down node; and
a first electrode of the seventh transistor is connected to the first power source signal terminal, and a second electrode of the seventh transistor is connected to the pull-down node
a gate of the ninth transistor is connected to the pull-down node, a first electrode of the ninth transistor is connected to the second power source terminal, and a second electrode of the ninth transistor is connected to the pull-up node; and
a gate of an i-th tenth transistor is connected to the pull-down node, a first electrode of the i-th tenth transistor is connected to the second power source terminal, and a second electrode of the i-th tenth transistor is connected to the i-th output terminal.

14. The shift register unit according to claim 13, wherein the i-th output circuit further comprises: a second transistor and a first capacitor, the input circuit is further connected to a second input signal terminal and a second control signal terminal, the input circuit further comprises: a fourth transistor and a second capacitor, the pull-down control circuit further comprises: an eighth transistor and a third capacitor, the shift register unit further comprises: a discharging circuit, and the discharging circuit comprises: an eleventh transistor;

wherein a gate of the second transistor is connected to the first power source terminal, a first electrode of the second transistor is connected to the pull-up node, and a second electrode of the second transistor is connected to the gate of the first transistor;

one terminal of the first capacitor is connected to the gate of the first transistor, and the other terminal of the first capacitor is connected to the second electrode of the first transistor;

a gate of the fourth transistor is connected to the second input signal terminal, a first electrode of the fourth transistor is connected to the second control signal terminal, and a second electrode of the fourth transistor is connected to the pull-up node;

one terminal of the second capacitor is connected to the pull-up node, and the other terminal of the second capacitor is connected to the second power source terminal;

a gate of the eighth transistor is connected to the second control signal terminal, a first electrode of the eighth transistor is connected to the second reset clock signal terminal, and a second electrode of the eighth transistor is connected to the gate of the seventh transistor;

one terminal of the third capacitor is connected to the pull-down node and the other terminal of the third capacitor is connected to the second power source terminal; and a gate of the eleventh transistor is connected to the discharging control terminal, a first electrode of the eleventh transistor is connected to the second power source terminal, and a second electrode of the eleventh transistor is connected to the pull-down node.

15. A driving method for a shift register unit, wherein the shift register unit comprises: an input circuit, a pull-down control circuit, a pull-down circuit and N output circuits, the N is an integer greater than or equal to 2, and the method comprises:
during a charging stage, in which a first control signal from a first control signal terminal is at a first potential and an input signal from a first input signal terminal is at a first potential, providing, by the input circuit, a pull-up node with the first control signal under the control of the input signal;

during an i-th output stage of N output stages, in which an i-th clock signal from an i-th clock signal terminal of N clock signal terminals is at a first potential and the pull-up node is maintained at the first potential, providing, by an i-th output terminal of an i-th output circuit, a gate line connected to the i-th output terminal with the i-th clock signal under control of the pull-up node, wherein i is positive integer less than or equal to N; and during a noise-reducing stage, in which the first control signal is at a first potential and a first reset clock signal from a first reset clock signal terminal is at a first potential, providing, by the pull-down control circuit, the pull-down node with a first power source signal from a first power source terminal under control of the first reset clock signal and the first control signal, and respectively providing, by the pull-down circuit, the pull-up node and each output terminal with a second power source signal from a second power source terminal under control of the pull-down node.

16. The method according to claim 15, wherein the shift register unit further comprises: a discharging circuit, and the method further comprising:
during a discharging stage, in which a discharging control signal from a discharging control terminal is at a first potential and a third power source signal from the second power source terminal is at a first potential, providing, by the discharging circuit, the pull-down node with the third power source signal under control of the discharging control signal.

17. A gate driving circuit, comprising M cascaded shift register units, wherein M is an integer greater than 1, and the shift register unit comprises:
an input circuit respectively connected to a first input signal terminal, a first control signal terminal and a pull-up node, and used to provide the pull-up node with a first control signal from the first control signal terminal under control of an input signal from the first input signal terminal;

N output circuits, wherein an i-th output circuit is respectively connected to an i-th clock signal terminal of N clock signal terminals, the pull-up node and an i-th output terminal of N output terminals, and is used to provide the i-th output terminal with an i-th clock signal from the i-th clock signal terminal under control of the pull-up node, wherein each output terminal of the N output terminals is connected to one gate line, N is an integer greater than or equal to 2, and i is a positive integer less than or equal to N;

a pull-down control circuit respectively connected to the first control signal terminal, a first reset clock signal terminal, a first power source terminal, a second power source terminal, the pull-up node and a pull-down node, and used to provide the pull-down node with a first power source signal from the first power source terminal under control of the first control signal and a first reset clock signal from the first reset clock signal terminal, and to provide the pull-down node with a second power source signal from the second power source terminal under control of the pull-up node;

a pull-down circuit respectively connected to the second power source terminal, each output terminal, the pull-up node and the pull-down node, and used to respectively provide each output terminal and the pull-up node with the second power source signal under control of the pull-down node; and among the M shift register units, an N-th output terminal of a j-th shift register unit is connected to a first input signal terminal of an (j+1)-th shift register unit, wherein j is an positive integer less than M.

18. The gate driving circuit according to claim 17, wherein the M shift register units comprise two groups of shift register units that are at two sides facing each other on a display panel.

19. The gate driving circuit according to claim 18, wherein among the M shift register units, a (2×p−1)-th shift register unit is at a first side of the display panel, and a (2×p)-th shift register unit is at a second side of the display panel, wherein the first side and the second side are two sides facing each other on the display panel, and p is a positive integer no greater than M/2.

20. A display device, comprising the gate driving circuit according to claim 17.

* * * * *